(12) United States Patent
Hummelen et al.

(10) Patent No.: US 8,481,996 B2
(45) Date of Patent: *Jul. 9, 2013

(54) ORGANIC MATERIAL PHOTODIODE

(75) Inventors: Jan Cornelis Hummelen, Groningen (NL); René Albert Johan Janssen, Heeze (NL); Joop Knol, Groningen (NL); Martinus Maria Wienk, Tilburg (NL); Johannes Martinus Kroon, Alkmaar (NL); Wilhelmus Johannus Hermanus Verhees, Amsterdam (NL)

(73) Assignee: Rijksuniversiteit Groningen, Groningen (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/887,897

(22) Filed: Sep. 22, 2010

(65) Prior Publication Data

US 2011/0015427 A1    Jan. 20, 2011

Related U.S. Application Data

(63) Continuation of application No. 11/205,791, filed on Aug. 17, 2005, now Pat. No. 7,906,797, which is a continuation of application No. PCT/NL2004/000116, filed on Feb. 17, 2004.

(30) Foreign Application Priority Data

Feb. 17, 2003   (EP) .................................... 03075461

(51) Int. Cl.
 *H01L 31/101* (2006.01)
(52) U.S. Cl.
 USPC ...................... 257/40; 257/184; 257/E31.001

(58) Field of Classification Search
 USPC ................... 257/40, 183, 186, 184, E31.001, 257/E31.058, E31.115
 See application file for complete search history.

(56) References Cited

U.S. PATENT DOCUMENTS

| 5,741,442 | A | 4/1998 | McBranch et al. |
| 5,759,725 | A | 6/1998 | Hirao et al. |
| 5,986,206 | A | 11/1999 | Kambe et al. |
| 6,580,027 | B2 | 6/2003 | Forrest et al. |
| 6,812,399 | B2 | 11/2004 | Shaheen et al. |
| 6,933,436 | B2 | 8/2005 | Shaheen et al. |
| 7,230,269 | B2 | 6/2007 | Rand et al. |
| 2002/0025490 | A1 | 2/2002 | Shchegolikhin et al. |

(Continued)

FOREIGN PATENT DOCUMENTS

| EP | 1063197 | 12/2000 |
| JP | 07-188129 | 7/1995 |

(Continued)

OTHER PUBLICATIONS

Haddon, R. C., "C70 Thin Film Transisters," J. Am. Chem. Soc. 1996, 118, 3041-3042.

(Continued)

*Primary Examiner* — Savitr Mulpuri
(74) *Attorney, Agent, or Firm* — Banner & Witcoff, Ltd.

(57) ABSTRACT

The present invention relates to a photodiode, comprising a photo-active layer which layer comprises at least one electron donating material, and at least one fullerene derivative as an electron accepting material. The present invention further relates to a method for making such a photo diode, to a photo-active layer and to a fullerene derivative.

15 Claims, 1 Drawing Sheet

U.S. PATENT DOCUMENTS

| | | | |
|---|---|---|---|
| 2003/0035979 | A1 | 2/2003 | Chen et al. |
| 2003/0065206 | A1 | 4/2003 | Bolskar et al. |
| 2003/0066950 | A1 | 4/2003 | Halls et al. |
| 2003/0129436 | A1 | 7/2003 | Ramm et al. |
| 2005/0224905 | A1 | 10/2005 | Forrest et al. |
| 2005/0245606 | A1 | 11/2005 | Kronholm et al. |
| 2006/0107996 | A1 | 5/2006 | Shaheen et al. |
| 2006/0141662 | A1 | 6/2006 | Brabec et al. |
| 2007/0131277 | A1 | 6/2007 | Gaudiana et al. |

FOREIGN PATENT DOCUMENTS

| | | |
|---|---|---|
| JP | 09-188726 | 7/1997 |
| JP | 09-246580 | 9/1997 |
| JP | 11-281474 | 1/2000 |
| WO | 94/05045 | 3/1994 |
| WO | 01/84644 | 11/2001 |

OTHER PUBLICATIONS

Malik, et al., "Thermoreversible Gelatin of Regioregular Poly(3-hexylthiophene) in Xylene," Macromolecules 2001, 34, 275-282.

Brabec et al., Photovoltaic properties of conjugated polymer/methanofullere composites embedded in polystyrene matrix, Feb. 3, 1999, Journal of Applied Physics, vol. 85 No. 9, pp. 6866-6872.

Brabec et al., Interpenetrating Networks of Fullerenes and Conjugated Polymers for Plastic Photovoltaics, May 2000, 16th European Photovoltaic Solar Energy Conference, pp. 39-42.

Arici et al., "Photovoltaic properties of nanocrystalline CuInS2—methanofullerence solar cells," Molecular Crystals and Liquid Crystals Science and Technology, 385:129 (2002).

Brabec et al., "Plastic Solar Cells," Advanced Functional Materials, 11(1):15-26 (2001).

Huynh et al., "Hybrid Nanorod-Polymer Solar Cells," Science, 295:2425-2429 (2002).

Kroon et al., "Accurate efficency determination and stability studies of conjugated polymer/fullerence solar cells," Thin Solid Films, 403-404, 223-228 (2002).

Luque et al., "Increasing the Efficiency of Ideal Solar Cells by Photon Induced Transitions at Intermediate Levels," Phys. Rev. Lett., 78(26):5014-5017 (1997).

Murray et al, "Synthesis and Characterization of Nearly Monodisperse CDE (E +S, SE, TE) Semi-Conductor Nanocrystallites," Am Chem. Soc. 115(19):8706-8715 (1993).

Shaheen et al., Application. Phys. Lett. 78:841-843 (2001).

Yu et al., "Large-Area, Full Color Image Sensors Made with Semiconducting Polymers," Advanced Materials, 17:1431-1433 (1998).

English Abstract and computer translation of JP 11-281474.

English Abstract and computer translation of JP 09-188726.

English Abstract and computer translation of JP 09-246580.

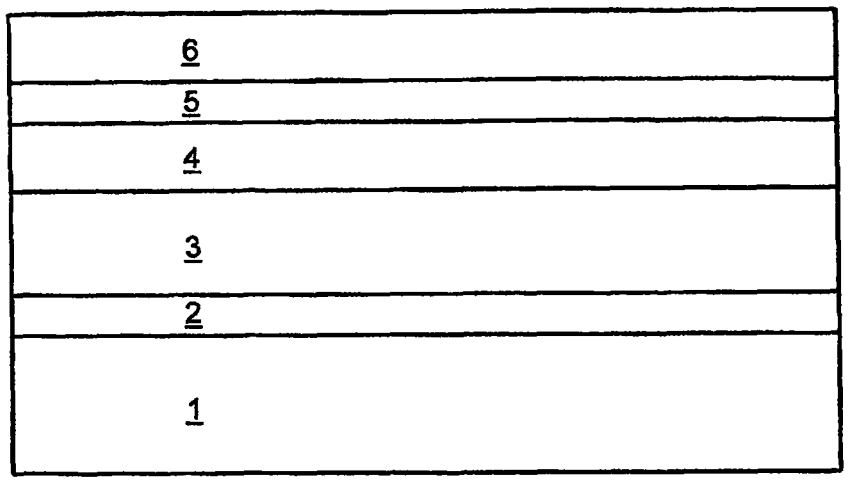

ORGANIC MATERIAL PHOTODIODE

RELATED APPLICATIONS

This application is a continuation of U.S. application Ser. No. 11/205,791 and filed Aug. 17, 2005 which is a continuation of PCT application number PCT/NL2004/000116 designating the United States and filed Feb. 17, 2004; which claims the benefit of EP patent application number 03075461.8 and filed Feb. 17, 2003, all of which are hereby incorporated by reference in their entireties.

FIELD OF THE INVENTION

The invention relates to a photodiode, and in particular a solar cell, based upon an electron donating material and a fullerene as an electron accepting material.

BACKGROUND OF THE INVENTION

Solar cells typically comprise a number of photovoltaic cells. Traditionally, these cells are inorganic pn hetero junction diodes comprising a layer of a p-type (electron donating) material and a layer of an n-type (electron accepting) material. Examples of materials for such inorganic diodes are silicon, gallium arsenide and cadmium sulphide.

In WO 94/05045 it is proposed to make a photodiode from a conjugated polymer to form the layer of the p-type material and to use fullerene, in particular buckminsterfullerene (C60 fullerene), to form a layer of the n-type material. A disadvantage of a photodiode wherein the p-type material and the fullerene are present in separate layers resides in the required thickness of the layers to provide an efficient photo-voltaic cell with sufficient light absorption. Due to the required thickness, the charge separation is found to be less efficient. Furthermore, the internal electric resistance may be increased to an unacceptable level.

U.S. Pat. No. 5,759,725 relates to a photoconductor which comprises a layer of amorphous fullerenes, acting as a charge-generating material, not as an electron accepting material. The diode may comprise a non-conductive transparent matrix polymer. A solar cell is shown wherein a film consisting of amorphous fullerene is present sandwiched between and in direct contact with the electrodes.

WO 01/84644 relates to a photovoltaic cell comprising two metal electrodes disposed on both sides of a photo-active layer. The photo-active layer is built up out of a conjugated polymer as an electron donating material and fullerene as an electron accepting material. The fullerene may be functionalised. The fullerene referred to in WO 01/84644 is Buckminsterfullerene (C60).

A problem often encountered with known fullerene based photo diodes, such as solar cells, is a relatively low efficiency and/or the fragility of the fullerene layer In order to make the fullerene layer less fragile, it has been proposed to prepare a heterojunction structure wherein the fullerenes react with another to form a polymeric fullerene, such as a fullerene dimer in EP 1 063 197.

There remains a need for alternative photo diodes, such as solar cells, that have a satisfactory efficiency and are preferably robust. Accordingly, it is an object of the present invention to provide a novel photo diode, in particular a novel solar cell, that can serve as an alternative to known photo diodes, respectively solar cells, with a satisfactory efficiency and robustness.

It has now been found that this object is realised by choosing a fullerene from a specific group of fullerenes as an electron-accepting material.

Accordingly, the present invention relates to a photodiode, preferably a solar cell, comprising a photo-active layer which comprises at least one electron donating material (the p-type material) and at least one fullerene derivative (as an electron acceptor; the n-type material), which fullerene derivative comprises a carbon cluster of at least 70 atoms and at least one addend attached to the carbon cluster, which addend is selected such that the fullerene derivative is compatible with or bound to the electron donating material.

FIG. 1 shows a schematic representation of a photodiode, such as solar cell.

It has been found that a photodiode according to the invention shows a very good efficiency, in particular in comparison to a similar cell with fullerenes having a carbon cluster of less than 70 atoms, such as $C_{60}$ fullerene.

It has been found that a photo-active layer in a photodiode according to the invention has an improved light absorbance in the range of 350-1000 nm, which has been found to result in an increased photo-voltaic effect, in comparison to a comparable photo-active layer wherein the fullerene is a $C_{60}$ fullerene derivative (e.g. about sixfold for a $C_{70}$ in comparison to $C_{60}$).

Further, a photo-active layer in a photodiode according to the invention has been found to have very good electron-accepting properties.

In addition, it has been found that in combination with a good light absorbance, the electric conductivity is highly satisfactory.

Accordingly, a photodiode according to the invention has been found to be very suitable for use in a variety of applications as an alternative to known photo diodes. A photodiode has been found particularly suitable for use as a solar cell, as a light intensity meter or as a photo detector, e.g. in an optical scanner, such as a flat bad scanner. Accordingly the present invention also relates to a solar cell, a solar panel, a light intensity meter, a photo detector (such as an optical scanner), comprising a photo diode as described in the present description or claims. Suitable ways to employ the photodiode(s) in such an apparatus are analogous to those for known photodiodes such as those based upon semi conductive polymers and C60 fullerene (derivatives). E.g. a photo detector may be made such as described in "Large-Area, Full-Color Image Sensors Made with Semiconducting Polymers", G. Yu; J. Wang; J. McElvain; A. J. Heeger, Advanced materials 10 (1998), 17, 1431-1433.

The p-type material, e.g. a conjugated oligomer or polymer, and the n-type material may be present in the photo-active layer as a mixture or may be present as separate sublayers of n-type material respectively p-type material. Very good results with respect to stability and robustness of the system and the efficiency have been achieved with a mixture of p-type and n-type material.

Fullerenes are clusters of covalently bonded atoms, mostly or all carbon atoms, providing a three-dimensional structure (also referred to as the carbon cluster). Typical structures are more or less spherical shapes (such as the "soccer-ball" shaped $C_{60}$ fullerene and the more oval $C_{70}$ fullerene) and cylindrical shapes (such as the tubular $C_{500}$ and $C_{540}$ fullerenes). The fullerene moiety of a fullerene derivative in a photodiode, such as a solar cell, according to the invention may be any fullerene comprising such a carbon cluster formed by at least 70 atoms. For practical reasons the amount of atoms forming the carbon cluster is preferably 960 or less, more preferably 240 or less, even more preferably 96 or less, e.g. $C_{70}$, $C_{76}$, $C_{78}$, $C_{80}$, $C_{82}$, $C_{84}$, $C_{86}$, $C_{88}$, $C_{90}$, $C_{92}$, $C_{94}$ or $C_{96}$.

Optionally a photodiode, such as a solar cell, comprises several different fullerenes, e.g. a mixture of fullerenes with a different amount of atoms and/or several isomers of a fullerene. It is also possible that a fraction of the fullerenes in the photodiode is underivatised. For example, from a practical view point it may be preferred to manufacture a cell according to the invention from a batch of derivatised fullerenes, wherein a residual amount of unreacted fullerenes is still present.

Preferably the photoactive layer comprises a fullerene derivative wherein the carbon cluster is formed by at least 76 atoms. It has been found that with such a fullerene a particularly good light absorption can be realised.

Preferably, essentially all atoms forming the carbon cluster are carbon atoms, although it is possible that a minority of the atoms is a different atom, e.g. a nitrogen, oxygen, sulphur or boron. Very good results have been obtained with a fullerene wherein 0-6 of the atoms forming the carbon clusters are atoms other than carbon. Optionally, the carbon cluster comprises one or more atoms inside the interior space of the carbon cluster, such as one or more lanthanides and/or alkali atoms.

The carbon cluster may form a single three-dimensional structure with one central space (referred to as a single cage, a single fullerene unit or a fullerene monomer), a fullerene-oligomer essentially consisting of several cages (e.g. a fullerene-dimer) or a fullerene-polymer essentially consisting of fullerene cages. Very good results have been achieved with a photodiode, in particular a solar cell, wherein the fullerene is a fullerene monomer. The term oligomer is used herein to describe a moiety comprising two to nine monomeric units (e.g. fullerene cages or organic monomers). The term polymer is used herein to describe a moiety comprising more than nine monomeric units.

The fullerene derivative further comprises at least one addend attached to the carbon cluster. The term addend is used herein to describe moieties that are compatible with the electron donating material, such that the fullerene derivatives adheres to the electron donating material when applied there to or such that the fullerene derivative is miscible with the electron donating material to form a mixed phase.

Thus, the term compatible is used to indicate that in combination with the p-type material the n-type material is miscible to form a photo-active layer with a suitable functionality to act as a photo-active layer. Typically, the compatibility contributes to the formation of an interpenetrating network of any kind. In particular, the fullerene derivative is considered to be compatible with the electron donating material when a mixture of the fullerene derivative and the electron donating material, present in a photoactive layer in a photodiode is capable of absorbing photons, then generating charge carriers (such as electrons and/or holes) and allowing migration of the charge carriers to an electrode, connected to the photoactive layer in an electrically conductive manner.

The mixed phase may be homogenous on a macro-scale. On a nano-scale it may be phase-separated and contain different phases which phases may differ in the ratio of p-type to n-type material. Macroscopically, the mixture may have a more or less uniform ratio throughout the thickness of the photo-active layer or the layer may be stratified, i.e. a layer wherein the ratio of p-type to n-type material changes gradually or stepwise throughout the thickness of the photo-active layer.

Preferably, the volume of the addend(s) is less than that of the fullerene(s). Thus it has been found possible to maintain the electron transport properties particularly well.

Examples of suitable addends are linear, branched or cyclic hydrocarbons. A hydrocarbon is optionally substituted and optionally contains one or more contains functional groups, e.g. selected from the group consisting of carboxylic esters, amides, ethers, lactones, lactams, urethanes, carbonates, acetals, amines and halogens.

A preferred addend comprises an alkyl group, more preferably an alkyl group with 1-12 carbon atoms, even more preferably with 2-7 carbon atoms. The alkyl groups may be linear, branched, or cyclic. Preferably at least the majority of the alkyl groups are linear. The alkyl groups may bear one or more substituents and/or functional groups. As functional groups, ethers and carboxylic esters with alkyl moieties of preferably 1-10 carbon atoms are particularly preferred. An addend may also be or contain one or more aryl groups. Examples of suitable aryl groups are those based on benzene, thiophene, pyrrole, pyrrolidine and furane. The aryl groups themselves may be substituted with one or more side chains. Preferred side chain are those selected from the group consisting of alkyl, alkoxy, alkoxycarbonyl, C- and/or N-alkylamido and aryl groups.

Very good results have been achieved with a (methano) fullerene derivatised with an addend comprising an aryl group plus an esterified alkane carboxylic acid group, and functional analogues of such a (methano)fullerene. The aryl may for example be phenyl, thiophene, indole, pyrrole or furan, of which phenyl is particularly preferred. The ester may be formed of a linear or branched C1-C20 carboxylic acid, preferably a C3-C7 carboxylic acid, more preferably a C4 carboxylic acid and a C1-C20 alkanol, preferably a C1-C4 alkanol. A highly preferred derivatised (methano)fullerene of this type is phenyl-butyric methylester derivatised fullerene (also referred to as [n]-PCBM wherein n is the number of atoms forming the carbon cluster).

For improving the voltaic properties of a photodiode, comprising a fullerene derivative comprising an aryl- (carboxylic acid alkyl)ester moiety, it has been found advantageous to substitute at least one of the hydrogens of the aryl (in particular the phenyl) with a carboxylic acid group, preferably a methoxy group. For improving the compatibility of a fullerene derivative comprising an aryl-(alkoxy alkyl)ester moiety, it has been found advantageous to substitute one or more of the hydrogens of the aryl with an alkyl or alkyl-like moiety.

Preferred derivatives of the PCBM type include (methano) fullerenes derivatised at the[6,6] position of (methano) fullerene and derivatisated that are derivatised at the [5,6] position, which are known as fulleroid or homo-fullerene.

Another group of particularly suitable fullerene derivatives are those selected from the group consisting of N- and/or C-substituted fullereropyrrolidines", "Diels-Alder adducts", "N-substituted [5,6]azafulleroids", "N-substituted ketolactams, such as those obtained by photooxygenation of [5,6] azafulleroids", "N-substituted fulleroaziridines";

It is not necessary that the addend absorbs photons in the VIS range (which is the case with dyes). In fact, it has been found that many visible light absorbing dyes tend to be detrimental to the electric conductivity of the photo-active layer. In particular in case a very high electric conductivity is desired, it is therefore preferred that the addend is essentially transparent to visible light. In practice an addend is considered transparent in case the extinction coefficient in the range of 400-800 nm of about 500 $cm^{-1} mol^{-1}$ or less.

The carbon cluster may comprise an addend at one or more of the atoms forming the cluster. Preferably the number average of fullerene-addend bonds per fullerene is in the range of 1-3.

In principle, the electron donating material can be any inorganic or organic material having electron donating properties when present in the vicinity of a fullerene derivative. For example, an electron donating material may be chosen from the group consisting of op p-type (semi)-conducting molecular materials, preferably p-type conjugated polymers, p-type conjugated oligomers, p-type conjugated molecules without repeating units (i.e. non-polymeric, non-oligomeric molecules), quantum dots & wells and inorganic semi-conductive nano-particles.

Particular suitable examples of electron donating molecules without repeating units include prophyrins, phtalocyanines, (both either with or without a metal atom or ion complexed), and substituted coronenes.

Particular suitable examples of quantum dots and wells include those described in Luque, A.; and Marti, A.: Increasing the Efficiency of Ideal Solar Cells by Photon Induced Transitions at Intermediate Levels. Phys. Rev. Lett., vol. 78, no. 26, 1997, pp. 5014-5017 and in Murray, C. B.; Norris, D. J.; and Bawendi, M. G.: Synthesis and Characterization of Nearly Monodisperse CDE (E=S, SE, TE) Semi-conductor Nanocrystallites. J. Am. Chem. Soc., vol. 115, no. 19, 1993, pp. 8706-8715.

Particular suitable examples of nanoparticles include nanocrystalline $CuInS_2$ and the like, e.g. as described in "Photovoltaic properties of nanocrystalline CuInS2-methanofullerene solar cells", Elif Arici; N. Serdar Sariciftci; Dieter Meissner, Molecular crystals and liquid crystals science and technology, vol. 385 (2002), pag. 129 or nano particles as described in Hybrid Nanorod-Polymer Solar Cells Wendy U. Huynh, Janke J. Dittmer, A. Paul Alivisatos, Science 295, 2425-9 (2002).

Preferred examples or p-type oligomers and polymers are oligomers respectively polymers of derivatised and underivatised thiophenes, phenylenes, fluorenes, acetylenes, isothionaphtenes, benzthiaziazoles, pyrroles and combinations thereof. A particular preferred combination is a p-type material selected from the group consisting of (phenylene vinylene) oligomers and polymers.

Suitable combinations include blends, copolymers and hybrid structures comprising said p-type material. In particular with respect to processability very good results have been achieved with a compound selected from the group consisting of oligo- and polyalkylthiophenes, oligo- and poly(dialkoxyphenylene vinylene)s, oligo- and poly(9,9-dialkylfluorenes) and with oligo- and poly(N-alkylpyrroles).

A highly preferred group of derivatives are the oligo- and poly(dialkoxyphenylene vinylene)s and in particular oligo- and poly[[2-methoxy-5-(3',7',-dimethyloctyloxy)]-p-phenylene vinylene] (MDMO-PPV).

A suitable ratio of fullerene derivative to p-type material, such as p-type polymer or oligomer, can routinely be determined for a particular combination of materials, based upon information disclosed herein and common general knowledge. Good results have for example been achieved with a photodiode, in particular a solar cell, wherein the p-type material to fullerene ratio (weight to weight) is about 10:1 to 1:10, preferably 1:1 to 1:5. Very good results have been achieved with a ratio of about 1:2 to 1:4. In practice, the photo-active layer preferably essentially consists of n-type material, in particular fullerene derivative, and p-type material.

FIG. 1 shows a schematic representation of a photodiode according to the invention. The outermost transparent layer 1 (facing the sun light when operational) serves as the substrate for the other layers. It may be made of any material through which sun-light (visible, UV and/or near IR, preferably at least visible and near IR) can pass and that is sufficiently stable when exposed to such light. Suitable materials for the outermost layer are known in the art. Preferred examples of such materials include glass, and transparent polymers, in particular plastics, such as poly ethylene therephtalate (PET). The photoactive layer 4 is positioned between two electrodes 2 and 6, one of which serves as the anode and the other as cathode. For practical reasons, the cathode is preferably positioned between the layer 1 and the photoactive layer 4. In case the anode is sufficiently transparent, the anode may be positioned between layers 1 and 4. Suitable materials for the cathode and the anode are known in the art and the skilled person will know how to choose a suitable combination. A preferred cathode is selected from the group consisting of Transparent Conducting Oxides, of which $SnO_2$:F, $SnO_2$:Sb, ZnO:Al, and Indium-Tin-Oxide (ITO) are particularly favoured examples. These show favourable transparency to allow passage of the photons to the photo-active layer. Suitable anodes include calcium, aluminium, barium, gold, platinum or silver. In principle it is possible to use a thin metal layer as the electrode between layer 1 and the photoactive layer 4, provided that the layer is (semi-) transparent. Optionally, the photodiode comprises one or more other layers. Suitable other layers have been reported ubiquitously in the art. Examples thereof are a poly(3,4 ethylene dioxythiophene)polystyrenesulphonate (PEDOT:PSS) layer 3, or a functional analogue of that material and/or a LiF layer 5 or a functional analogue thereof.

The dimensions of the various layers may be chosen within wide ranges. The skilled person will know how choose suitable values, depending upon the chosen materials and the desired specifications for the cell. Good results have for example been achieved with an electrode 2 thickness in the range of about 20 to 500 nm (in particular with ITO), a PEDOT:PSS layer 3 in the range of about 20 to 500 nm, a photoactive layer 4 in the range of about 20 to 1000 nm, a LiF layer 5 in the range of about 0.1 to 10 nm and a electrode 6 in the range of about 20 to 1000 nm.

The present invention further relates to a method for preparing a photodiode, in particular a solar cell, wherein at least one p-type material, preferably a (semi)-conductive polymer, and at least one fullerene as defined herein are mixed with a liquid and thereafter dried to form the photo-active layer.

The present invention further relates to a method for preparing a photodiode, in particular a solar cell, wherein a photo-active layer is made by applying a sub-layer, comprising at least one electron donating material as defined herein to a substrate (usually including one of the electrodes and optionally a layer such as PEDOT:PSS) and applying a separate sub-layer comprising at least one fullerene derivative, as defined herein, to the substrate.

The p-type material, the n-type material, respectively a mixture thereof, can be applied by any means known in the art, suitable for the specific p-type material, e.g. by spin-coating, ink jet printing, doctor blading, spray coating, solvent casting in case of a p-type polymer or p-type oligomer.

It has surprisingly been found that the fullerene-derivative can suitably be applied directly from a solution of the fullerene-derivative, e.g. by spin-coating, dipping, pouring and egalising. In contrast thereto, fullerene based n-type layer in a photodiode, such as a solar cell, described in the prior art, is typically made by a vaporising technique, which tends to be difficult and expensive.

The present invention further relates to a fullerene derivative as described herein, in particular to a fullerene derivative wherein the carbon cluster is formed of 70-960 atoms, more preferably of 76-240 atoms, even more preferably of 86-240 atoms. More in particular the invention further relates to a fullerene derivative of the type [n]-PCBM, as defined above, wherein n is the number of atoms forming the cluster. Other preferences are as indicated herein for the fullerene-derivative in a photodiode, as described herein. A fullerene derivative according to the invention, may be made in a manner analogously to the preparation of a corresponding C60 fullerene.

The present invention further relates to the use of a fullerene derivative as described herein, for improving the photo-voltaic effect, in particular for increasing photo-voltaic power conversion efficiency in a photo-active layer, preferably for improving the light absorbing and/or electron accepting properties.

The invention will now further be illustrated by the following examples.

EXAMPLE 1

The preparation was carried out analogously to the procedure described in S. E. Shaheen et al. Appl. Phys. Lett. 78, 841-843 (2001), wherein a C60 fullerene was used.

Poly [2-methoxy, 5-(3',7'-dimethyl-octyloxy)-p-phenylene-vinylene] (MDMO-PPV) was used as the electron donor and [6,6]-Phenyl-butyric acid methyl ester derivatised C70 fullerene ([70]-PCBM) as the electron acceptor. ITO/glass substrates were used as front electrode. A PEDOT-PSS layer (Bayer AG, EL-Grade) of about 100 nm was spin cast on top of the ITO layer from an aqueous suspension. The photoactive layer (about 80 nm) was spin cast from a 1,2-dichlorobenzene solution with a 1:4 weight ratio of MDMO-PPV and PCBM. As top-electrode, a thin LiF about 1 nm and subsequently a 100 nm Al layer were deposited on top of the organic layers by thermal evaporation.

For comparative reasons another cell was made in the same manner but with [60]-PCBM as the electron accepting material.

The efficiencies of both cells were determined as described in "Accurate efficiency determination and stability studies of conjugated polymer/fullerene solar cells", J. M. Kroon, M. M. Wienk, W. H. Verhees, J. C. Hummelen, Thin Solid Films 403-404, 223-228 (2002)). The efficiency of the solar cell with [70]-PCBM was 20% higher than the efficiency of the collar cell with [60]-PCBM (3.0% instead of 2.5%).

What is claimed:

1. A combination comprising an electron donating material and a mixture of isomers of a fullerene derivative comprising a carbon cluster of at least 70 atoms, wherein the derivative includes a methanofullerene comprising at least one addend bound to the carbon cluster, wherein the addend comprises a substituted or unsubstituted aryl moiety or a substituted or unsubstituted alkyl moiety, wherein the mixture of isomers is compatible with the electron donating material in a photoactive layer and wherein a degree of derivatisation of the fullerene derivatives is 1 to 3 fullerene-addend bonds per fullerene derivative.

2. The combination of claim 1 wherein the carbon cluster includes between 70 atoms and 960 atoms.

3. The combination of claim 1 wherein the carbon cluster includes between 76 atoms and 240 atoms.

4. The combination of claim 1 wherein the carbon cluster includes between 86 atoms and 240 atoms.

5. The combination of claim 1 wherein the fullerene derivative includes [70]-PCBM, [76]-PCBM, [78]- PCBM, or [84]-PCBM.

6. The combination of claim 1 wherein the substituted or unsubstituted alkyl moiety includes between 1 to 12 carbon atoms.

7. The combination of claim 1 wherein the addend includes an aryl- (carboxylic acid alkyl) ester group.

8. The combination of claim 1 wherein the atoms include carbon, nitrogen, oxygen, sulfur or boron.

9. The combination of claim 1 wherein the addend includes substituted or unsubstituted linear, branched or cyclic hydrocarbons.

10. The combination of claim 1 wherein the addend includes one or more functional groups including carboxylic esters, amides, ethers, lactones, lactams, urethanes, carbonates, acetals, amines or halogens.

11. The combination of claim 1 wherein the substituted or unsubstituted aryl moiety includes one or more of phenyl, thiophene, indole, pyrrole, pyrrolidine or furan.

12. The combination of claim 11 wherein the substituted aryl includes aryl substituted with one or more of alkyl, alkoxy, alkoxycarbonyl, carboxylic acid, ester, (carboxylic acid alkyl)ester, (alkoxy alkyl)ester C- and/or N-alkylamido or aryl.

13. The combination of claim 1 wherein the electron donating material includes conjugated polymers, conjugated oligomers, conjugated molecules that are free of repeating units, quantum dots, quantum wells or inorganic semi-conductive nanoparticles.

14. The combination of claim 13 wherein the conjugated polymer includes polymers of thiophenes, phenylenes, fluorenes, acetylenes, isothionaphtenes, benzthiaziazoles, or pyrroles or combinations thereof.

15. The combination of claim 13 wherein the conjugated oligomer includes oligomers of thiophenes, phenylenes, fluorenes, acetylenes, isothionaphtenes, benzthiaziazoles, or pyrroles or combinations thereof.

* * * * *